United States Patent
Genc et al.

(10) Patent No.: US 12,118,456 B1
(45) Date of Patent: *Oct. 15, 2024

(54) INTEGRATED MACHINE LEARNING TRAINING

(71) Applicant: Amazon Technologies, Inc., Seattle, WA (US)

(72) Inventors: Sahika Genc, Mercer Island, WA (US); Bharathan Balaji, Seattle, WA (US); Urvashi Chowdhary, Seattle, WA (US); Leo Parker Dirac, Seattle, WA (US); Saurabh Gupta, Redmond, WA (US); Vineet Khare, Redmond, WA (US); Sunil Mallya Kasaragod, San Francisco, CA (US)

(73) Assignee: Amazon Technologies, Inc., Seattle, WA (US)

( * ) Notice: Subject to any disclaimer, the term of this patent is extended or adjusted under 35 U.S.C. 154(b) by 1102 days.

This patent is subject to a terminal disclaimer.

(21) Appl. No.: 16/198,730

(22) Filed: Nov. 21, 2018

(51) Int. Cl.
  *G06N 3/08* (2023.01)
  *G06F 30/20* (2020.01)

(52) U.S. Cl.
  CPC ............... *G06N 3/08* (2013.01); *G06F 30/20* (2020.01)

(58) Field of Classification Search
  CPC .................................. G06N 3/08; G06F 30/20
  See application file for complete search history.

(56) References Cited

U.S. PATENT DOCUMENTS

| | | | |
|---|---|---|---|
| 2016/0232445 A1* | 8/2016 | Srinivasan | G06N 3/047 |
| 2017/0132512 A1* | 5/2017 | Ioffe | G06N 3/04 |
| 2017/0140270 A1* | 5/2017 | Mnih | G06N 3/04 |
| 2018/0157973 A1* | 6/2018 | El-Yaniv | G06N 3/0454 |
| 2018/0222048 A1 | 8/2018 | Hasegawa | |
| 2018/0293498 A1* | 10/2018 | Campos | H04L 67/01 |
| 2018/0357543 A1* | 12/2018 | Brown | G06N 3/044 |
| 2019/0050875 A1 | 2/2019 | McCord | |
| 2019/0197409 A1* | 6/2019 | Frinken | G06N 3/08 |
| 2019/0279082 A1 | 9/2019 | Moloney et al. | |
| 2020/0034701 A1* | 1/2020 | Ritter | G06F 9/50 |
| 2020/0034747 A1* | 1/2020 | Elturki | G06N 3/08 |
| 2020/0118145 A1 | 4/2020 | Jain et al. | |

OTHER PUBLICATIONS

Fan, Linxi, et al. "Surreal: Open-Source Reinforcement Learning Framework and Robot Manipulation Benchmark," 2nd Conference on Robot Learning (CoRL 2018); Zurich, Switzerland, 2018.

* cited by examiner

*Primary Examiner* — Michael J Huntley
*Assistant Examiner* — Imad Kassim
(74) *Attorney, Agent, or Firm* — Knobbe, Martens, Olson & Bear, LLP (57) ABSTRACT

A machine learning environment utilizing training data generated by customer networks. A reinforcement learning machine learning environment receives and processes training data generated by simulated hosted, or integrated, customer networks. The reinforcement learning machine learning environment corresponds to machine learning clusters that receive and process training data sets provided by the integrated customer networks. The customer networks include an agent process that collects training data and forwards the training data to the machine learning clusters. The machine learning clusters can be configured in a manner to automatically process the training data without requiring additional user inputs or controls to configure the application of the reinforcement learning machine learning processes.

20 Claims, 10 Drawing Sheets

INTEGRATED MACHINE LEARNING TRAINING

BACKGROUND

A service provider may make a network service available for use by third parties. For example, the field of utility computing involves a service provisioning model in which a service provider makes computing resources and infrastructure management available to client devices on demand. For example, a user may wish to deploy a machine learning service to analyze image data such as of products, users, or documents. Machine learning services can rely on sophisticated modeling and training to provide accurate analysis of image data. The modeling and training can be resource and time intensive operations and require significant understanding of the complexities contributing needed to produce a satisfactory model.

Network service models allow users to access networked resources (e.g., applications, services, and data) via a client program, such as a web browser. Network services, such as web services, provide programmatic access to networked resources including technology platforms (e.g., image processing applications and services) and data (e.g., image data and other databases) hosted on networked computers via a service interface. Generally speaking, a network service interface provides a standard, cross-platform API (Application Programming Interface) for communication between a client requesting some service to be performed and the service provider. In some embodiments, a network service interface may be configured to support the exchange of documents or messages including information describing the service request and response to that request. Such documents, or messages, may be exchanged using standardized or proprietary messaging protocols, such as the Hypertext Transfer Protocol (HTTP), and may be formatted in a platform-independent data format, such as extensible Markup Language (XML).

BRIEF DESCRIPTION OF THE DRAWINGS

Embodiments of various inventive features will now be described with reference to the following drawings. Throughout the drawings, reference numbers may be re-used to indicate correspondence between referenced elements. The drawings are provided to illustrate example embodiments described herein and are not intended to limit the scope of the disclosure.

DETAILED DESCRIPTION

Network services can be powerful tools that allow clients to perform a wide variety of processing operations. For example, image analysis algorithms can be applied to many domains, such as medical or health care, social networks, autonomous driving, and others. With advances in artificial intelligence, machine learning, and related applications, more and more users are engaging with such systems. Wide adoption, however, can be hindered in part because not all users in these domains have sufficient time or resources to deploy state-of-the-art solutions. The features described in this application provide an end-to-end solution to generate services including reinforcement learning models for users with little or no prior knowledge of simulation or artificial intelligence techniques or limited access to data to train a useful model.

Reinforcement learning (RL) is similar to supervised learning, but on a continuously changing dataset. It is desirable to minimize the number of updates to the model based on each sampled dataset. RL is generates models based on Markov Decision Processes (MDPs) or Partially Observable Markov Decision Processes (POMDPs). RL models may consider five categories of parameters at every time step: an environment, a state, an action, a reward, and an observation. The state may indicate the information about the past that is relevant to the future. As an example, consider a robot agent that can move in any direction at any time step. The position of the robot is its state, since once the system knows where the robot is located, the system need not understand how the robot got there. An action refers to what an agent does. In the above robot example, the chosen direction of motion at some time may be the action. The environment is the world the agent lives in. The primary function of the environment is, given an action and the current state, move the system to the next state and emit a reward. In the robot example, a new state may be the new position of the robot, and the reward may be one if a hidden treasure is found, and zero otherwise. The goal of RL is to learn a policy that maps from states to an action such that the agent maximizes its long term reward. This could be, for example, how quickly the robot finds the treasure. RL model training may be based on the agent interactions with its environment. In many applications, the environment can be modeled as a simulator. The simulator can create the labels which may be used to train the model.

A simulation environment may include an agent and a simulator. For example, a car racing game can be considered as a simulator. A convolutional neural network (CNN) that consumes images from the simulator and generates actions to control the game controller may represent the agent. With multiple simulations, the environment generates training data of the form <state_t, action, state_t+1, reward_t+1>. The definition of the reward is not trivial and can impacts the RL model quality. The reward functions may be one aspect that can be identified from previous training to expedite the generation of new models.

Features are described to perform training and/or simulation as part of the generation of an RL model. Training and simulation may be integrated within a single environment or decoupled for execution onto different environments. The decoupled execution can help with independent scaling of the two aspects, depending on algorithmic and application-specific-simulation requirements. Decoupling also enables use of virtual environments as a simulation environment, or integration with legacy simulators such as simulator which only runs on specific operating systems or are hosted at network locations remote to the training environment.

Figure 1:
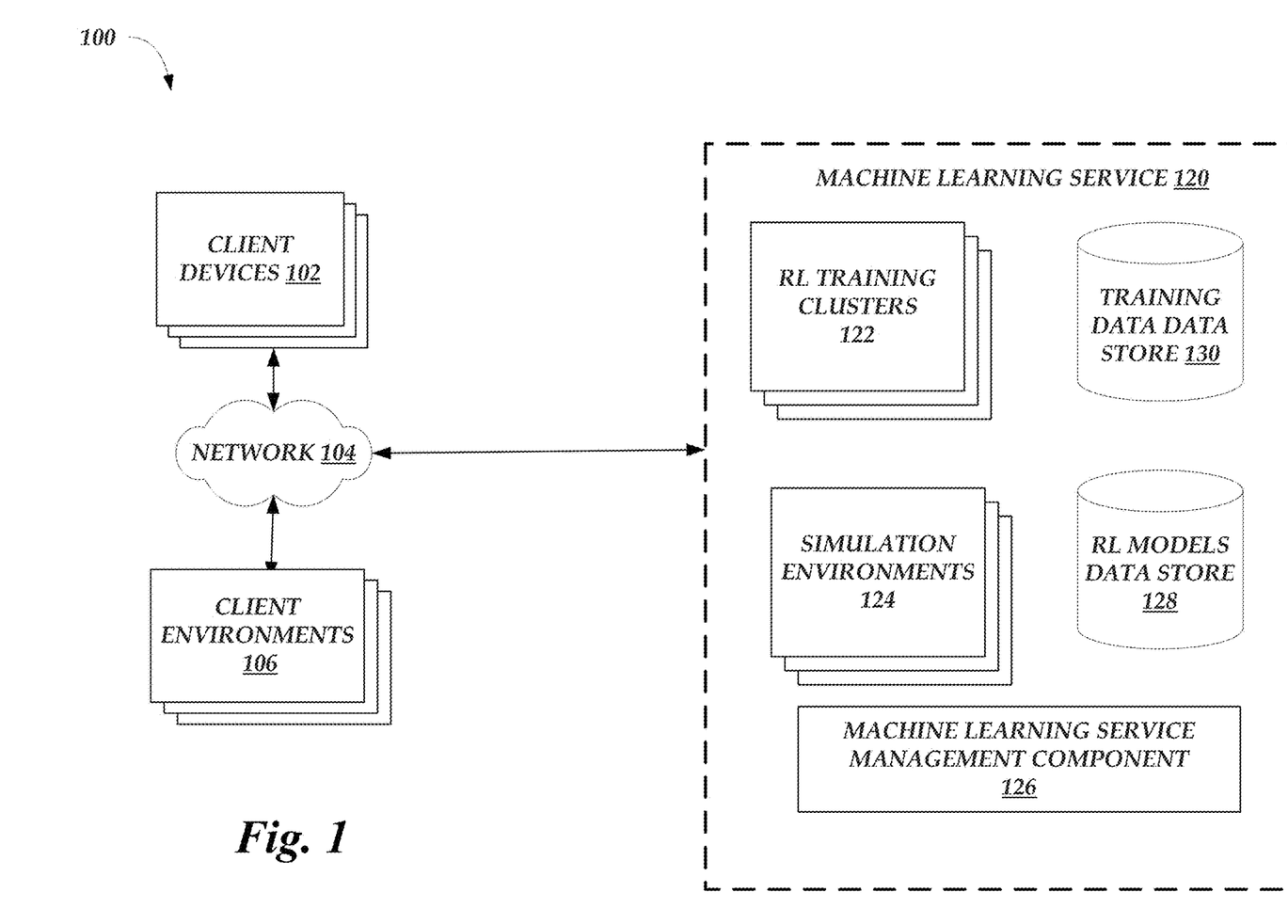
FIG. 1 depicts an embodiment of an environment for providing networked machine learning services.

FIG. 1 depicts an embodiment of an environment for providing networked machine learning services. The environment 100 may include a client device 102 configured for networked communications. Via a network 104, the client device 102 may access a machine learning service 120. The machine learning service 120 may be hosted by a physical server attached to a network address or a virtual server operating within a virtual private cloud or virtual private network. The client device 102 may access the machine learning service 120 through an interface. The interface may be a machine interface, sometimes referred to as an application programming interface. The machine interface allows an application executing on the client device 102 to transmit machine-readable messages to the machine learning service 120 to request machine learning models. In some implementations, the interface may be a graphical user interface including control elements to collect information for a training request and transmit the training request to the machine learning service 120.

A machine learning management component 126 may be included in the machine learning service 120. The machine learning management component 126 may process the incoming training requests as described herein. For example, the machine learning management component 126 may instantiate an RL training cluster 122 for training the requested model. The machine learning management component 126 may instantiate a simulation environment 124 for the requested model.

Because multiple clients may be transmitting different training request, the machine learning management component 126 may monitor multiple RL training clusters and/or simulation environments. The machine learning management component 126 may dynamically instantiate the RL training clusters or simulation environments based on the training request. For example, it may be determined, based on previous RL model training, that a specific hardware configuration provides sufficient processing resources to generate a model at a desired accuracy in a specified period of time. The machine learning management component 126 may identify the parameters for instantiating the RL training cluster and/or simulation environment 124.

The models that are generated may be stored in an RL model data store 128. The models may be stored in association with an identifier for the client and the model. This can allow the client to request a hosted model service that can process requests using the model. For example, the client may submit a request including the identifier for the model and the machine learning service 120 may create a virtual server attached to a network address that will forward packets received to the model. In response, the output of the model will be forwarded to the requesting device or an address specified by the requesting device.

Training data may be used to generate the model. The training data may be provided by the client device in or associated with the training request. The training data may be collected from the simulation environment 124. For example, the machine learning service 120 may monitor the simulation environment 124 while executing for a training request. Event data monitored during the execution, or provided via the training request, may be stored in a training data store 130.

In some implementations, a training request may specify a custom simulator to use for training. The custom simulator may be executing in a client environment 106. The training request may include information to connect to the custom simulator such as a network address, login credentials, and the like. In such instances, the simulation environment 124 may proxy simulation inputs and outputs with the custom simulator via messages to the client environment 106.

Figure 2:
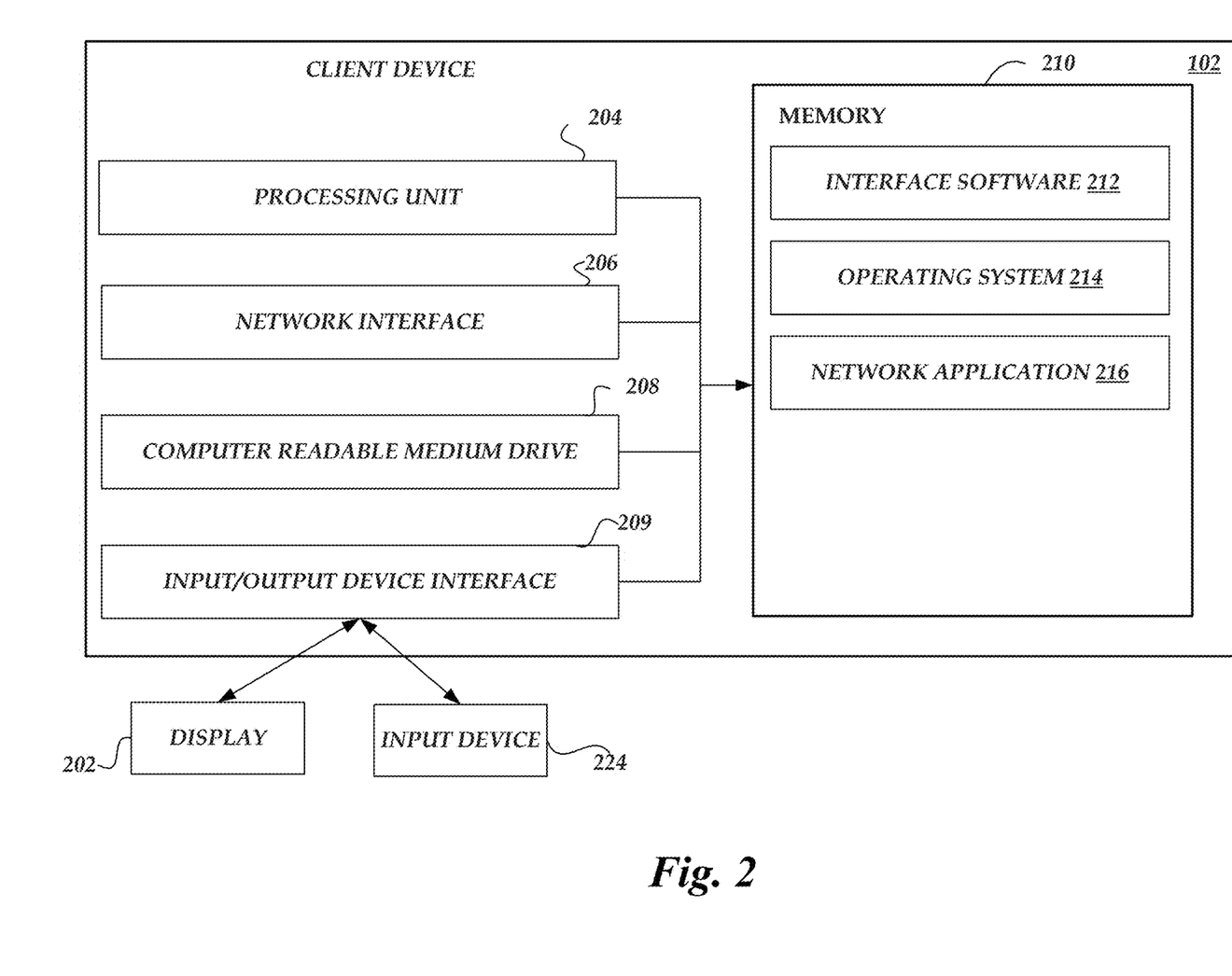
FIG. 2 depicts one embodiment of an architecture of an illustrative client device 102 that can generate content requests and process content requests in accordance with the present application.

FIG. 2 depicts one embodiment of an architecture of an illustrative client device 102, such as a personal computer, tablet computer, smartphone, or other device, that can generate content requests and process content requests in accordance with the present application. The general architecture of the client device 102 depicted in FIG. 2 includes an arrangement of computer hardware and software components that may be used to implement aspects of the present disclosure. As illustrated, the client device 102 includes a processing unit 204, a network interface 206, a computer readable medium drive 208, an input/output device interface 209, an optional display 202, and an input device 224, all of which may communicate with one another by way of a communication bus. In various embodiments, components such as the display 202 and/or the input device 224 may be integrated into the client device 102, or they may be external components that are coupled to the device 102.

The network interface 206 may provide connectivity to one or more networks or computing systems, such as the network 104 of FIG. 1. The processing unit 204 may thus receive information and instructions from other computing systems or services via a network. The processing unit 204 may also communicate to and from memory 210 and further provide output information for an optional display 202 via the input/output device interface 209. The input/output device interface 209 may also accept input from the optional input device 224, such as a keyboard, mouse, digital pen, etc. In some embodiments, the client device 102 may include more (or fewer) components than those shown in FIG. 2.

The memory 210 may include computer program instructions that the processing unit 204 executes in order to implement one or more embodiments. The memory 210 generally includes RAM, ROM, or other persistent or non-transitory memory. The memory 210 may store an operating system 214 that provides computer program instructions for use by the processing unit 204 in the general administration and operation of the client device 102. The memory 210 may further include computer program instructions and other information for implementing aspects of the present disclosure. For example, in one embodiment, the memory 210 includes a network application 216, such as browser application or media player, for accessing and requesting models via the machine learning service 120. In other embodiments, the memory 210 may include a separate interface software 212 for facilitating the creation and configuration of RL models for a user.

Figure 3:
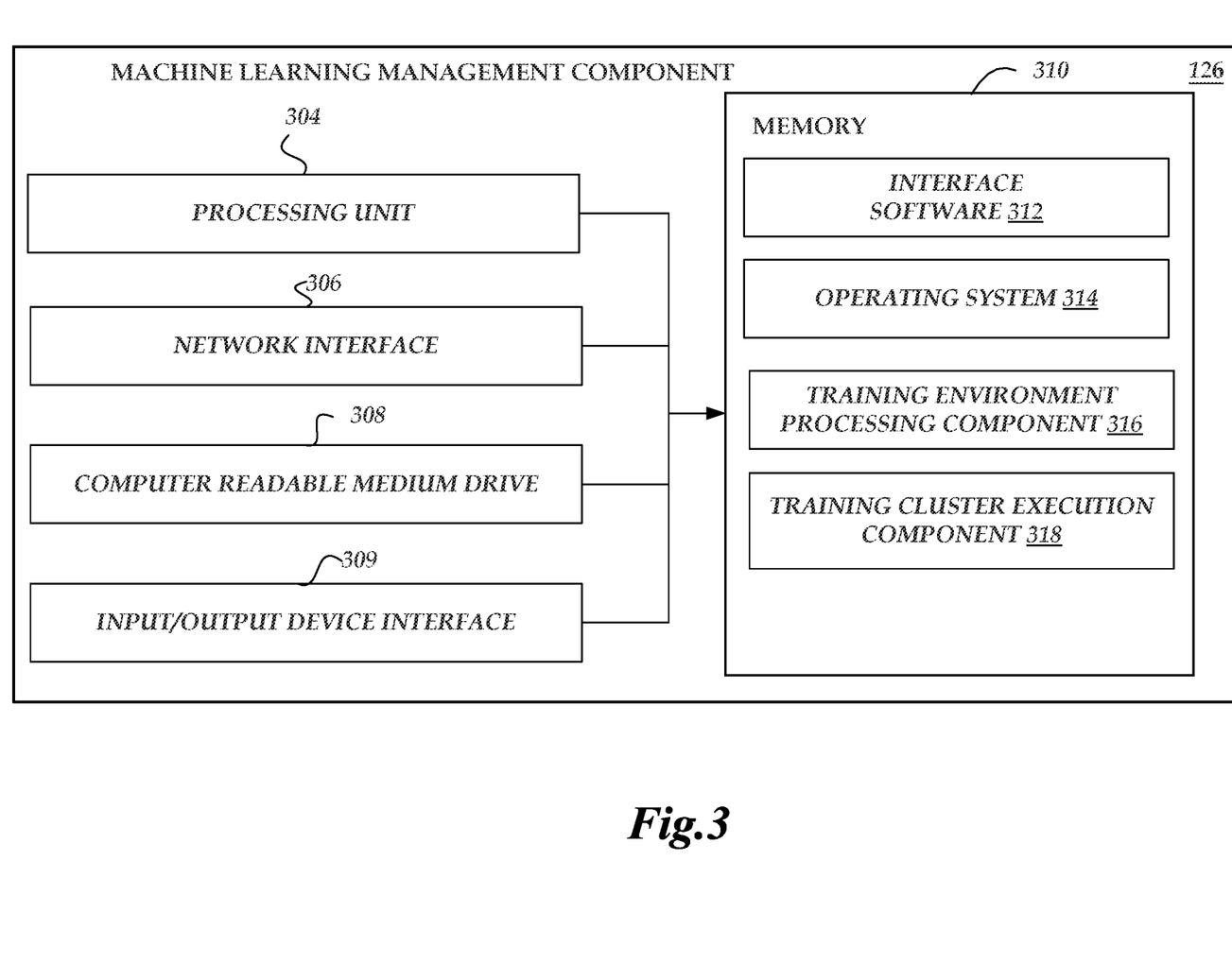
FIG. 3 depicts one embodiment of an architecture of an illustrative server for implementing the machine learning management component of the RL modeling environments described.

FIG. 3 depicts one embodiment of an architecture of an illustrative server for implementing the machine learning management component 126 of the RL modeling environments described. The general architecture of the machine learning management component 126 depicted in FIG. 3 includes an arrangement of computer hardware and software components that may be used to implement aspects of the present disclosure. As illustrated, the machine learning management component 126 includes a processing unit 304, a network interface 306, a computer readable medium drive 308, and an input/output device interface 309, all of which may communicate with one another by way of a communication bus. The components of the machine learning management component 126 may be physical hardware components or implemented in a virtualized environment.

The network interface 306 may provide connectivity to one or more networks or computing systems, such as the network 104 of FIG. 1. The processing unit 304 may thus receive information and instructions from other computing systems or services via a network. The processing unit 304 may also communicate to and from memory 310 and further provide output information for an optional display via the input/output device interface 309. In some embodiments, the machine learning service 120 may include more (or fewer) components than those shown in FIG. 3.

The memory 310 may include computer program instructions that the processing unit 304 executes in order to implement one or more embodiments. The memory 310 generally includes RAM, ROM, or other persistent or non-transitory memory. The memory 310 may store an operating system 314 that provides computer program instructions for use by the processing unit 304 in the general administration and operation of the machine learning service 120. The memory 310 may further include computer program instructions and other information for implementing aspects of the present disclosure. For example, in one embodiment, the memory 310 includes interface software 312 for receiving and processing content requests from client devices 102 and managing RL training and simulation environments responsive to a training request. Additionally, the memory 310 includes a training environment processing component 316 for instantiating a training environment based on criteria associated with the requesting client device 102, training request, and the like. The training environment may include a simulator selected by the machine learning service 120 based at least in part on the training request. The memory 310 includes a training cluster execution component 318 for instantiating a simulation environment including a simulator for training the requested model.

Figure 4:
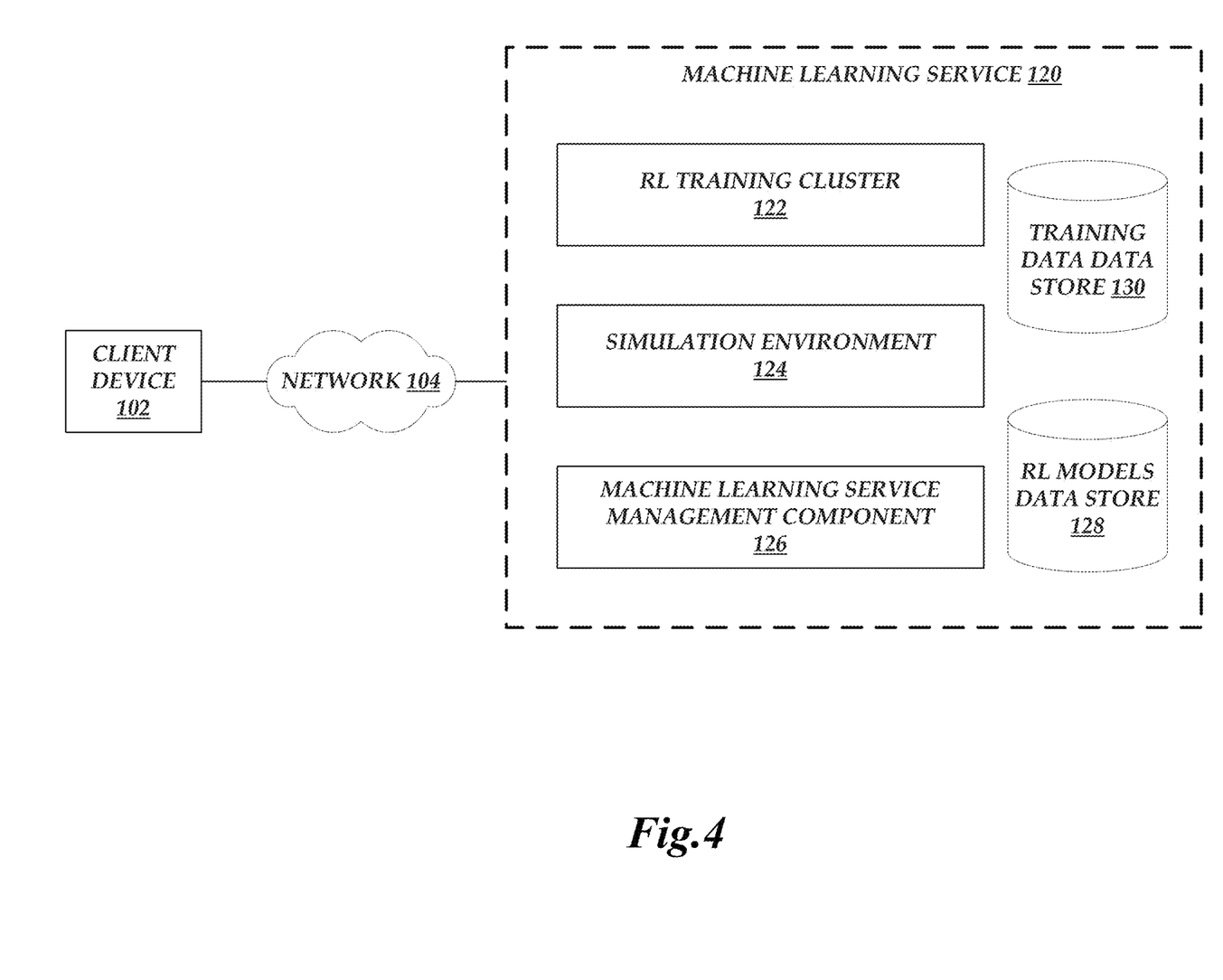
FIG. 4 is a block diagram showing one embodiment for integrated RL training.

FIG. 4 is a block diagram showing one embodiment for integrated RL training. The machine learning service 120 shown in FIG. 4 is configured for integrated training. Integrated training generally refers to a common environment for the RL training cluster 122 and the simulation environment 124. The client device 102 may submit a training request and the machine learning service management component 126 may instantiate the RL training cluster 122 and the simulation environment 124 as described.

Figure 5:
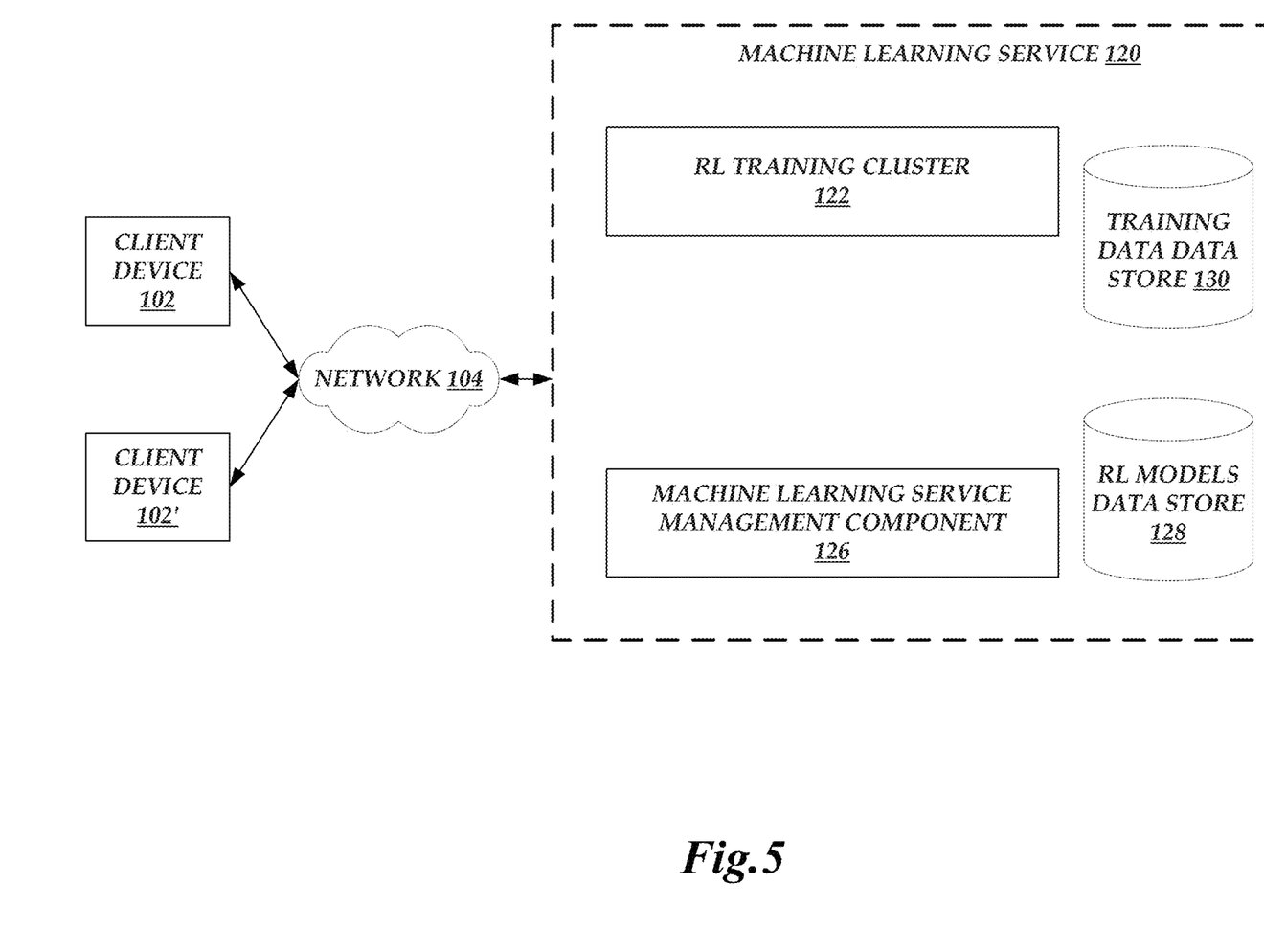
FIG. 5 is a block diagram showing one embodiment of a decoupled RL training.

FIG. 5 is a block diagram showing one embodiment of a decoupled RL training. In contrast to FIG. 4, the machine learning service 120 may not instantiate a simulation environment but instead access a client device 102' as the environment to train the RL model. The environment may be a virtual environment simulated by the client device 102'. The environment may include the physical world as detected by the client device 102'. The decoupled nature of the embodiment shown in FIG. 5 arises from the distribution of the environment simulation aspect of the training to a device separated from the RL training cluster 122.

Figure 6:
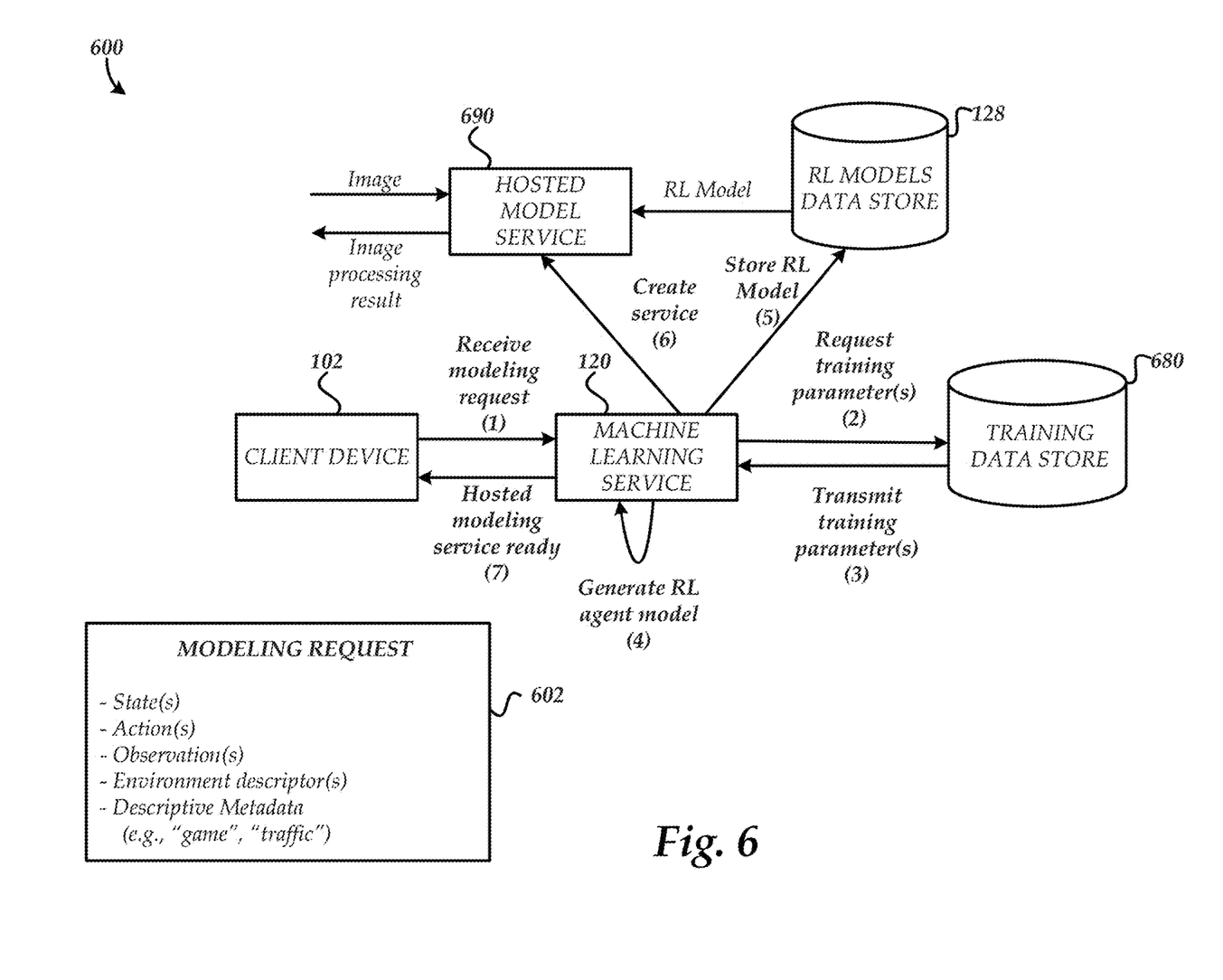
FIG. 6 is a block diagram showing an environment for generating a hosted model service from a modeling request.

FIG. 6 is a block diagram showing an environment for generating a hosted model service from a modeling request. The environment 600 includes several entities which communicate to generate the hosted model service 690. The hosted model service 690 shown in FIG. 6 receives an image as an input and generates an image processing result (sometimes referred to as an action) as an output. In some embodiments, the image processing result includes a set of actions, each associated with a confidence or ranking for each action. For example, if the image provided to the hosted model service 690 shows a video game state, the hosted model service 690 may provide an image processing result indicating different actions to take with associated probabilities of maximizing the reward. In case where the video game is being played against a player with a lower difficulty setting, a non-optimal but plausible action may be desired over the action that maximizes the reward.

In the embodiment shown in FIG. 6, the creation of the hosted model service 690 is initiated by a modeling request 602. The modeling request 602 includes states, actions, or observation(s). In some embodiments, the modeling request 602 includes training data as part of the request. In some embodiments, the modeling request 602 includes a reference to the training data such as a network location of a data source storing the training data. The modeling request 602 may include descriptive model metadata that indicates the objects or task associated with the requested model. The modeling request 602 optionally includes an identifier for the client requesting the model. The identifier of the client may be used to identify a domain to which the requested model will apply. The domain may be identified based on a profile stored in a data store for the client. The hosted modeling service 690 may be deployed in a virtual private cloud or other virtualized environment. The virtualized environment may be instantiated within an execution container allocated for the domain associated with the identifier.

The client device 102 transmits the modeling request 602 to a machine learning service 120. The machine learning service 120 interprets the modeling request 602 and coordinates the generation of the hosted modeling service 690 for the modeling request 602. In previous systems, a model may be trained to perform the task specified in the modeling request 602. However, training each model from scratch for each request can be time or resource intensive. Embodiments of the present disclosure can avoid this inefficiency and high resource demand by allocating resources for training (e.g., virtualized environment settings), identifying simulators and training data, and tuning parameters of the model based on models previously trained or deployed in the environment 600.

To address training inefficiencies, the machine learning service 120 may identify training parameters, including resource configurations, for previously trained models. The parameters may be stored in a training data store 680. For example, if the training data store 680 includes parameters for a previously trained model associated with descriptive metadata corresponding to the descriptive metadata provided in the modeling request 602, the hyperparameters, simulator, or cluster configuration used for training the previous model may be used to train the requested model. Metadata, such as domain information, may be associated with a client requesting the previously trained models and used to identify a previously trained model.

As used herein a "data store" may be embodied in hard disk drives, solid state memories and/or any other type of non-transitory computer-readable storage medium accessible to or by a device such as an access device, server, or other electronic computing device described. A data store may also or alternatively be distributed or partitioned across multiple local and/or remote storage devices as is known in the art without departing from the scope of the present disclosure. In yet other embodiments, a data store may include or be embodied in a data storage web service.

In some embodiments, the parameters may be selected based on frequency of access, inclusion in other generated models, or other model metrics. In some embodiments, metrics for the models may be used identify which of the multiple models to select. The metrics may be generated based on interaction data with machine learning services associated with different models. For example, if a model is used many times over a period of time as compared to another model, the model's utilization may indicate that the model is superior to other models. Alternative or additional metrics that are used to select models include the ranking of a model for use in servicing previous requests or a similarity between data used to train the models. For example, if the modeling request 602 includes reference images of a particular size, data type (e.g., GIF, PNG, JPG, MPG), or quality, the size or quality is compared with the size or quality of the data used to train the models identified in the training data store 680. In some embodiments, parameters for the model associated with training data with the size or quality most similar to the size or quality of the reference images is selected.

Based on the one or more of the factors described, the machine learning service 120 may identify the training parameter(s) to use for generating the new machine learning model for the modeling request 602.

After generating the new machine learning model, the machine learning service 120 shown in the environment 600 of FIG. 6 may store the trained model in the RL model data store 128. An identifier may be associated with the trained image model to aid in identifying the model.

The machine learning service 120 may generate the hosted model service 690 based on the trained model. Generating the hosted model service 690 may include creating a service instance to receive image requests which are processed using the trained reinforcement learning model to provide image processing results. The hosted model service 690 may obtain the RL model from the RL model data store 128 based on the identifier for the RL model.

Figure 7:
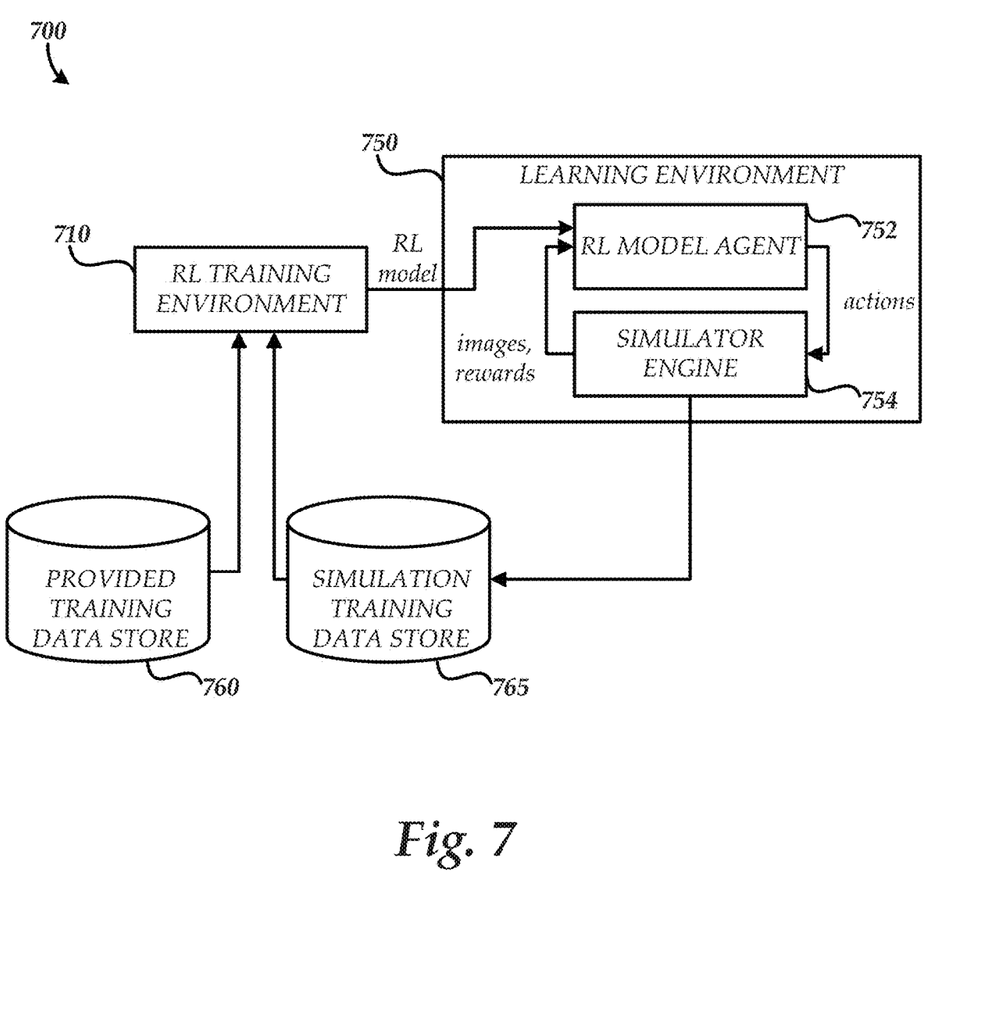
FIG. 7 is a block diagram showing an environment for simulation based reinforcement learning training.

FIG. 7 is a block diagram showing an environment for simulation based reinforcement learning training. The environment 700 illustrates the relationship between an RL training environment 710 and a learning environment 750. The environment 700 may be a virtual environment whereby the RL training environment 710 and the learning environment 750 are executing on virtual hardware in a virtual private cloud. The RL training environment 710 may be created by the machine learning service 120. The RL training environment 710 may include a cluster of one or more virtual hardware instances for training the RL model. The cluster configuration parameters such as the number of nodes in the cluster, virtual hardware specification for one or more nodes (e.g., emulated hardware, memory, bandwidth, etc.) may be specified using historical cluster configuration parameters for previously trained models. The RL environment may be tailored to generate a convolutional neural network (CNN) model. The CNN model may receive, as inputs, state and reward information and generate, as outputs, a vector of actions. Each action may be associated with a probability of yielding the highest reward. In some implementations the CNN model may be used to pre-process environment data such as images or other detected environment information. The pre-processing may, for example, extract features from the provided input data which may then be used by the RL model to generate a next action.

The RL training environment 710 may generate the CNN using provided training data. The training data may be stored in a provided training data store 760. The training data may include images such as of a video game display or a road. The training data may include text or other alphanumeric data.

The training may include instantiating the learning environment 750. The learning environment 750 may be integrated or decoupled from the RL training environment, as discussed above. The learning environment 750 may include a cluster of one or more virtual hardware instances for training the RL model. The cluster configuration parameters such as the number of nodes in the cluster, virtual hardware specification for one or more nodes (e.g., emulated hardware, memory, bandwidth, etc.) may be specified using historical cluster configuration parameters for a simulator used to previously train similar models. Parameters for the learning environment 750 may be selected from a library of environments based on the training request. In some implementations, the learning environment 750 may include an environment interface to broker communications with an environment such as an external system or other sensing device.

The learning environment 750 may include an RL model agent 752 and a simulator engine 754. The RL model agent 752 may provide an executable agent within the learning environment 750. For each time step of a simulation period, the RL model agent 752 may receive state information such as an image of the environment and a reward. Based on these inputs, the RL model agent 752 will identify an action to perform. This action is passed to the simulator engine 754. The simulator engine 754 may then adjust the RL model agent 752 within the environment simulated by the simulator engine 754. The adjustment may include moving a robot the specified distance or turning the wheel of an automobile by a specified number of degrees. Once the adjustment is applied, the simulator engine 754 may advance the simulation to the next step and generate a new representation of the environment along with some reward for the agent's action. For example, if the reward function measures the distance of a vehicle from the sides of a road, the more centered the vehicle is, the higher a reward for actions that maintain the vehicle centered. This action-reward loop may continue for a specified number of steps, period of processing time, until a quantity of event data is generated or until another event is detected by the learning environment 750.

The event data generated during the simulation may be stored in a simulated training data store 765. This data may provide feedback to the RL training environment 710 to further train a model. For example, the CNN may be trained using the time series of action and reward where the action is taken in response to a previous state.

Figure 8:
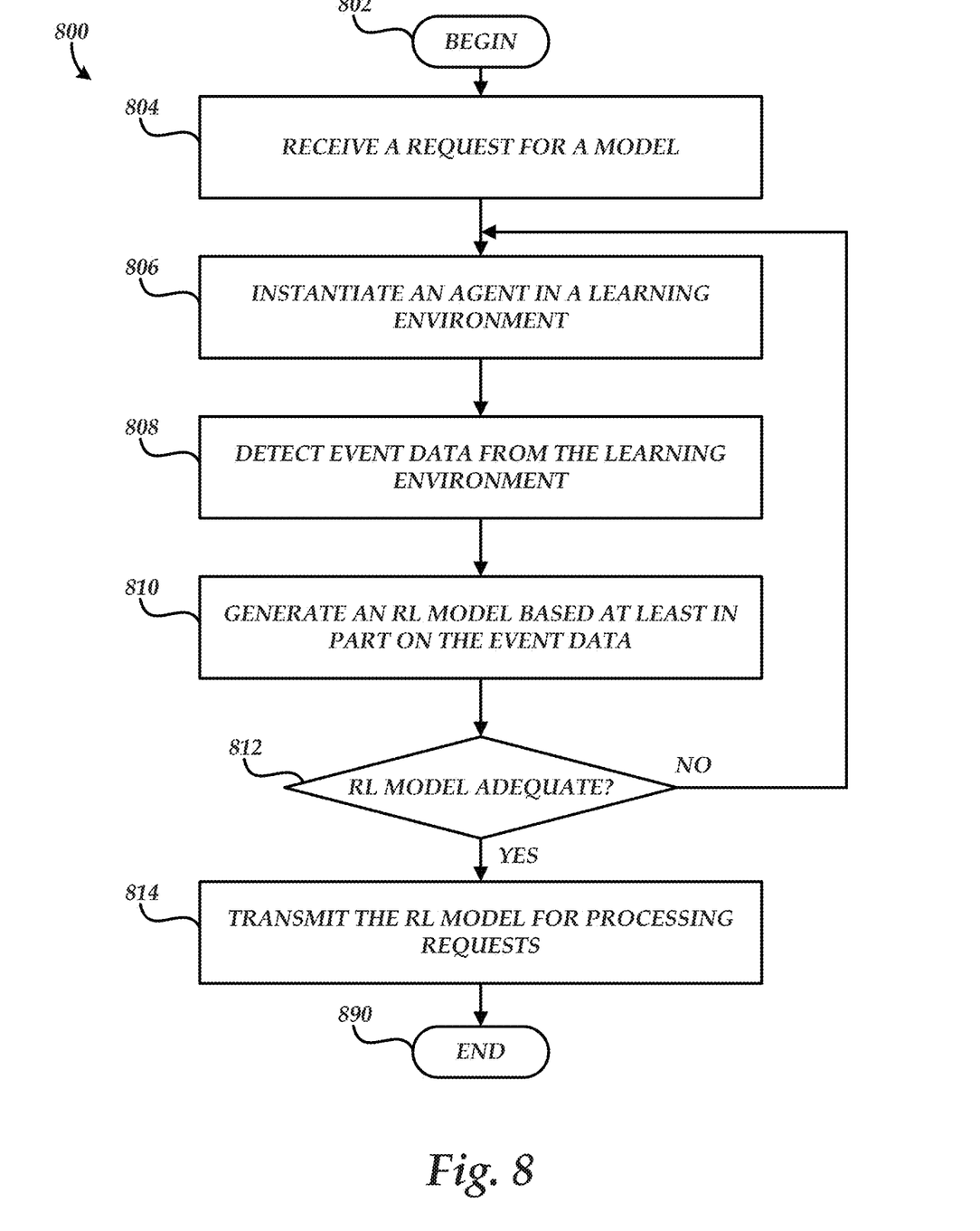
FIG. 8 is a process diagram showing one embodiment of a method for generating an RL model.

FIG. 8 is a process diagram showing one embodiment of a method for generating an RL model. The method 800 shown in FIG. 8 may be implemented or controlled in whole, or in part, by a coordination device such as the machine learning management component 126 described. The method 800 shows how a training request may be processed to generate an RL model to a desired specification. The method 800 begins at block 802.

At block 804, the coordination device may receive a request for a model. The request may specify a reinforcement learning type to be used for training the model. The request may include other parameters such as actions, states, environments, simulators, descriptive metadata, or other information to indicate to the coordination device the desired RL model. The request may be received from a client device using a GUI or API.

At block 806, the coordination device may instantiate an agent in a learning environment. The environment may include a virtual device hosting a simulator. The agent may include a CNN configured to receive an image as an input and generate a vector of values. The vector of values may each be associated with a feature recognized in the image. The vector of values may each be associated with an action that the agent is likely to take within the learning environment. In some implementations, the CNN may be trained using reward information for a previous action associated with a previous state of the actor. The training may include backpropagation or other machine learning techniques.

At block 808, the coordination device may detect event data from the learning environment. The detection of event data may include receiving information sensed within the learning environment such as images or location information (e.g., coordinates). The detection of event data may include training events such as rewards or actions taken. The detection may include maintaining a temporal information for the event data. This allows reconstruction of a time series of events and actions which can be used to train the RL model at block 810.

At block 812, the coordination device may determine whether the RL model is adequate. Adequacy may be assessed based on a target accuracy for the RL model. The adequacy may be assessed based on resources used to operate the model (e.g., memory, speed to processing an input request). The target accuracy may be specified a total reward earned by the agent. The target accuracy may be specified as a reward minimization whereby the RL model is trained to abstain from negative actions and models associated with lower rewards are favored.

If the determination is negative, the method 800 may return to block 806 to repeat aspects of the training process in an attempt to improve the accuracy of the RL model. If the determination at block 812 is affirmative, at block 814, the coordination device may transmit the RL model for processing requests. The transmission may include transmitting the RL model to the client device 102 or the client environment 106. In some implementations, the transmission may include storing the RL model in a model data store. In some implementations, the transmission may include instantiating a hosted model service that receives requests at a network address for processing by the RL model. The method 800 may then end at block 890. It will be appreciated that the method 800 may be repeated to retrain the RL model such as based on new training data or a different simulator or within a different learning environment. The method 800 may be repeated to train a new RL model according to a different training request from the same or different client devices.

Figure 9:
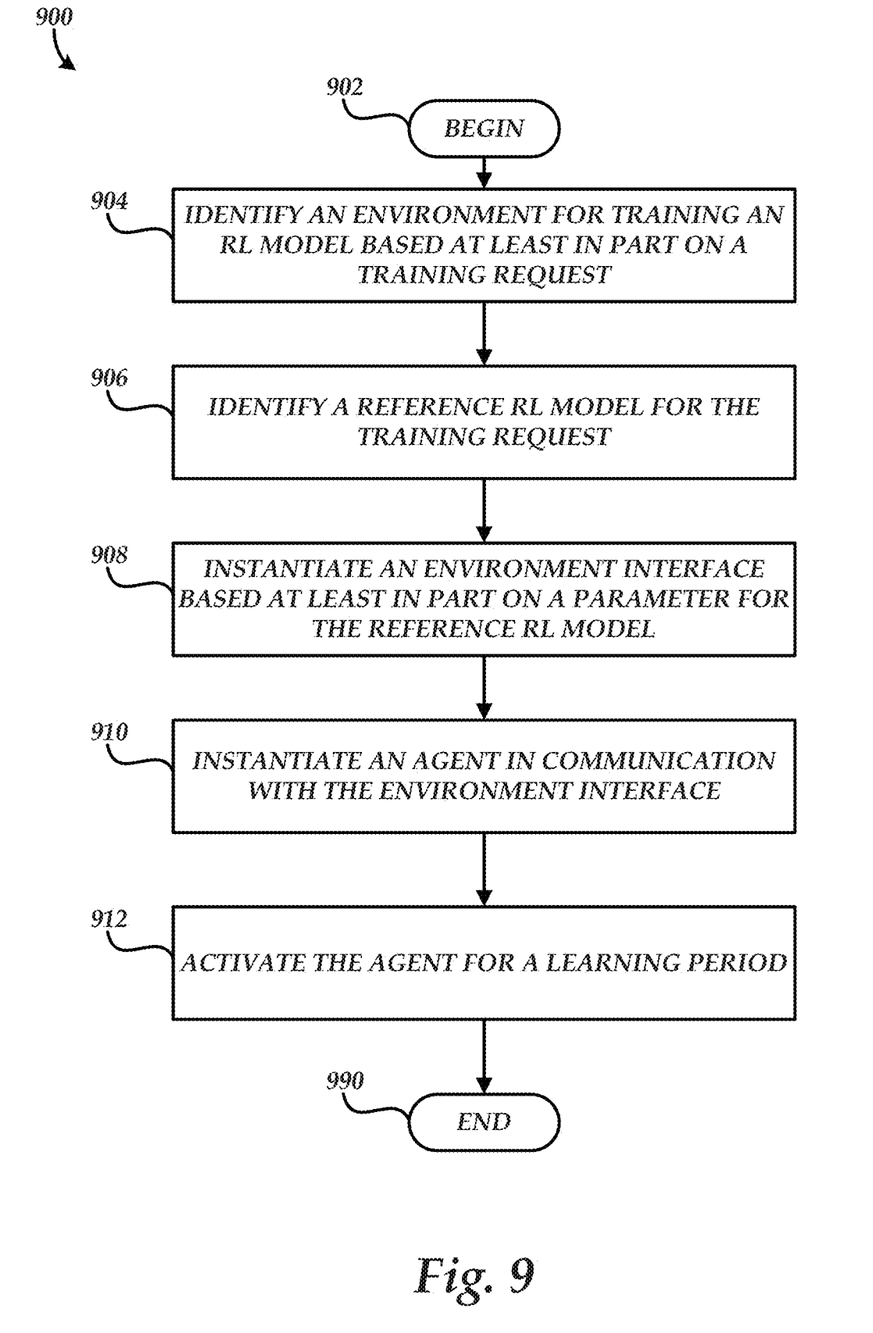
FIG. 9 is a process diagram showing one embodiment of a method for configuring devices for generating an RL model.

FIG. 9 is a process diagram showing one embodiment of a method for configuring devices for generating an RL model. The method 900 shown in FIG. 9 may be implemented or controlled in whole, or in part, by a coordination device such as the machine learning management component 126 described. The method 900 shows how physical or virtual resources may be configured to generate an RL model. The method 900 begins at block 902.

At block 904, the coordination device may identify an environment for training an RL model. The identification at block 904 may be based at least in part on a training request received from, for example, a client device. The environment may include an RL training cluster environment or a simulation environment. The environment may be configured to dynamically allocate the processing resources of the environment.

At block 906, the coordination device may identify a reference RL model for the training request. The reference RL model may be identified based on similarities to the training request such as training data type, actions, states, descriptive metadata or the like.

At block 908, the coordination device may instantiate an interface with the environment based at least in part on a parameter for the reference RL model. The interface may be instantiated to provide an appropriate number of cluster nodes or training the RL model. The parameter may be identified or based on a parameter used in training the reference RL model.

At block 910, the coordination device may instantiate an agent in communication with the environment interface. The instantiation of the agent may also be based on a parameter used in training the reference RL model. The instantiation may include a CNN or other machine learning element to process inputs to the RL model or as part of the RL model. In such instances, the architecture of the CNN or the RL model (e.g., actions or states), may be determined or influenced by corresponding components of the reference RL model.

At block 912, the coordination device may activate the agent for a learning period. Activating the agent may include providing state information for the environment to the agent and receiving an action to change a state of the agent. In response to the state change, the environment may provide updated state information along with a reward to provide feedback to the agent regarding the desirability of a result caused by the selected action. The learning period may include iterating over several action-reward cycles. The event data generated during the learning period (e.g., action, reward, state, etc.) may be detected by the coordination device. The event data may be stored for further training of the RL model as described.

The method 900 may end at block 990 but may be repeated to train additional RL models or update the training for the RL model.

Figure 10:
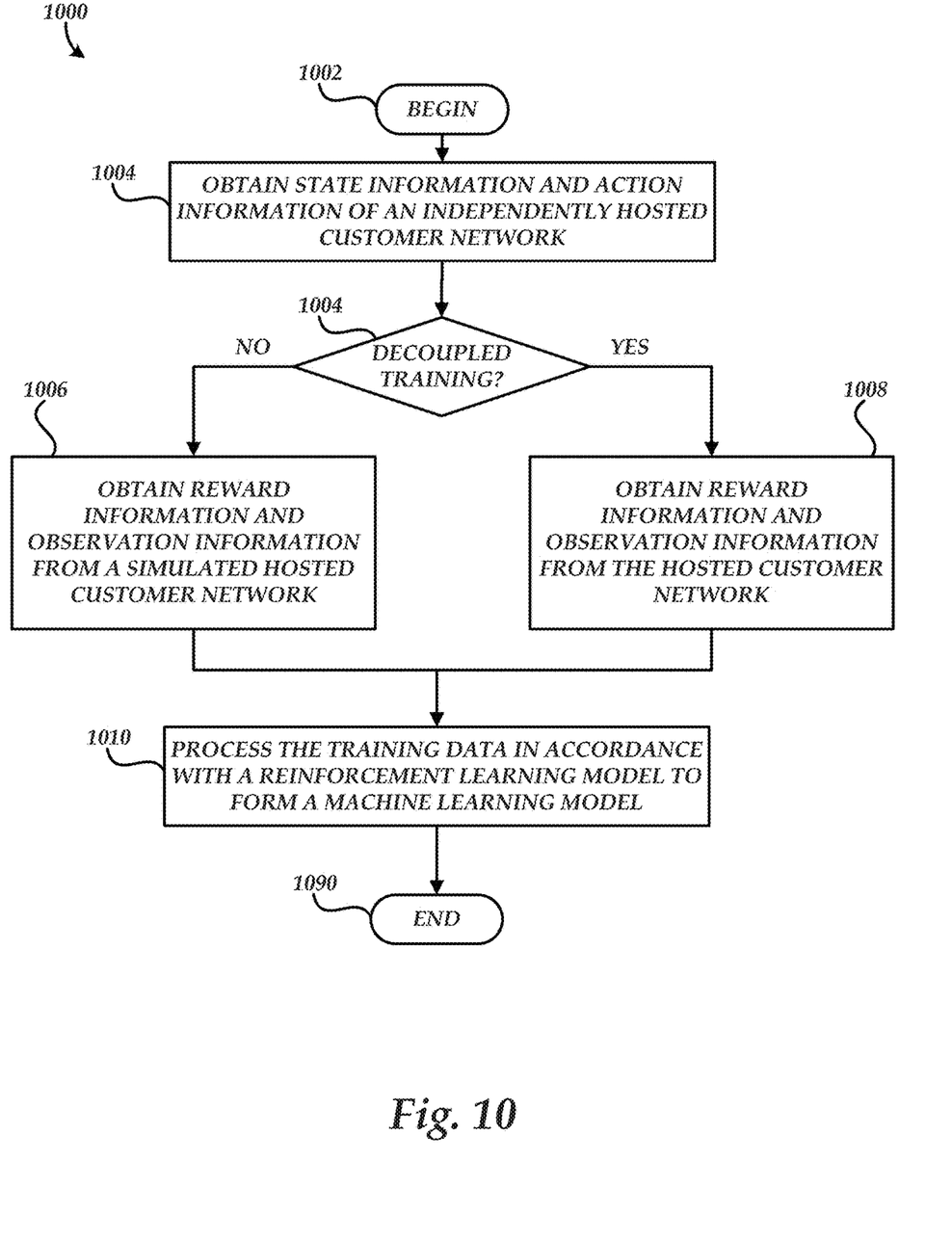
FIG. 10 is a process diagram showing one embodiment of a method for dynamically identifying training data for an RL model.

FIG. 10 is a process diagram showing one embodiment of a method for dynamically identifying training data for an RL model. The method 1000 shown in FIG. 10 may be implemented or controlled in whole, or in part, by a coordination device such as the machine learning management component 126 described. The method 1000 shows how training data may be differentially acquired for generating an RL model. The method 1000 begins at block 1002.

At block 1004, the coordination device may obtain state information and action information for an independently hosted customer network. At block 1004, the coordination device may determine whether the training is decoupled or integrated. The determination at block 1004 may be based on a training request which may include a training data source. If the determination at block 1004 is negative, at block 1006, the coordination device may obtain reward information and observation information from a simulated hosted customer network. The simulated hosted customer network may include a simulation environment managed in a virtual private cloud. If the determination at block 1004 is affirmative, at block 1008, the coordination device may obtain reward information and observation information from the hosted customer network. For example, the customer environment may include a simulator or environment manager than can be accessed using a programming interface (e.g., API). This allows training of RL models by the machine learning service using externally hosted (e.g., decoupled) training resources.

At block 1010, the coordination device may process the training data in accordance with a reinforcement learning model to form a machine learning model. The processing at block 1010 may include generating or updating a CNN for feature detection. The processing at block 1010 may include generating or updating a RL model configured to receive current state information and reward information for a previous action and generate one or more recommended actions for the current state information. The method 1000 may end at block 1090 but may be repeated to retrain the machine learning model or train a different machine learning model.

In some implementations, the machine learning service 120 may include compression features to reduce the resources needed for a model. The resources may include processing speed, processing time, or memory needed to store the model. The compression may be implemented as a reinforcement learning process. For example, a generic network compression container may be provided. The container may be configured with a compression request identifying the model and compression criteria. In some implementations, the container may access custom interface elements such as to train a model, test the accuracy of a model, remove layers of a model, identify the number of layers in a model, identify the shape of the input data space, or identify the model reward. The machine learning service 120 may include one or more actions to compress a model and, using environments similar to those described above, generate a compression agent that takes one or more compression actions to maximize and expected future reward (e.g., increase in speed or decrease in memory utilization). In some implementations, a model may be compressed prior to transmission to reduce the resources needed to deploy or use the model on a target system (e.g., robot, car, device).

Depending on the embodiment, certain acts, events, or functions of any of the processes or algorithms described herein can be performed in a different sequence, can be added, merged, or left out altogether (e.g., not all described operations or events are necessary for the practice of the algorithm). Moreover, in certain embodiments, operations or events can be performed concurrently, e.g., through multithreaded processing, interrupt processing, or multiple processors or processor cores or on other parallel architectures, rather than sequentially.

The various illustrative logical blocks, modules, routines, and algorithm steps described in connection with the embodiments disclosed herein can be implemented as electronic hardware, or as a combination of electronic hardware and executable software. To clearly illustrate this interchangeability, various illustrative components, blocks, modules, and steps have been described above generally in terms of their functionality. Whether such functionality is implemented as hardware, or as software that runs on hardware, depends upon the particular application and design constraints imposed on the overall system. The described functionality can be implemented in varying ways for each particular application, but such implementation decisions should not be interpreted as causing a departure from the scope of the disclosure.

Moreover, the various illustrative logical blocks and modules described in connection with the embodiments disclosed herein can be implemented or performed by a machine, such as a machine learning service server, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A machine learning service server can be or include a microprocessor, but in the alternative, the machine learning service server can be or include a controller, microcontroller, or state machine, combinations of the same, or the like configured to generate and publish machine learning services backed by a machine learning model. A machine learning service server can include electrical circuitry configured to process computer-executable instructions. Although described herein primarily with respect to digital technology, a machine learning service server may also include primarily analog components. For example, some or all of the modeling, simulation, or service algorithms described herein may be implemented in analog circuitry or mixed analog and digital circuitry. A computing environment can include any type of computer system, including, but not limited to, a computer system based on a microprocessor, a mainframe computer, a digital signal processor, a portable computing device, a device controller, or a computational engine within an appliance, to name a few.

The elements of a method, process, routine, or algorithm described in connection with the embodiments disclosed herein can be embodied directly in hardware, in a software module executed by a machine learning service server, or in a combination of the two. A software module can reside in RAM memory, flash memory, ROM memory, EPROM memory, EEPROM memory, registers, hard disk, a removable disk, a CD-ROM, or any other form of a non-transitory computer-readable storage medium. An illustrative storage medium can be coupled to the machine learning service server such that the machine learning service server can read information from, and write information to, the storage medium. In the alternative, the storage medium can be integral to the machine learning service server. The machine learning service server and the storage medium can reside in an ASIC. The ASIC can reside in a user terminal. In the alternative, the machine learning service server and the storage medium can reside as discrete components in a user terminal (e.g., access device or network service client device).

Conditional language used herein, such as, among others, "can," "could," "might." "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without other input or prompting, whether these features, elements and/or steps are included or are to be performed in any particular embodiment. The terms "comprising." "including." "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

As used herein, the terms "determine" or "determining" encompass a wide variety of actions. For example, "determining" may include calculating, computing, processing, deriving, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing, and the like.

As used herein, the term "selectively" or "selective" may encompass a wide variety of actions. For example, a "selective" process may include determining one option from multiple options. A "selective" process may include one or more of: dynamically determined inputs, preconfigured inputs, or user-initiated inputs for making the determination. In some embodiments, an n-input switch may be included to provide selective functionality where n is the number of inputs used to make the selection.

As used herein, the terms "provide" or "providing" encompass a wide variety of actions. For example, "providing" may include storing a value in a location for subsequent retrieval, transmitting a value directly to the recipient, transmitting or storing a reference to a value, and the like. "Providing" may also include encoding, decoding, encrypting, decrypting, validating, verifying, and the like.

As used herein, the term "message" encompasses a wide variety of formats for communicating (e.g., transmitting or receiving) information. A message may include a machine readable aggregation of information such as an XML document, fixed field message, comma separated message, or the like. A message may, in some embodiments, include a signal utilized to transmit one or more representations of the information. While recited in the singular, it will be understood that a message may be composed, transmitted, stored, received, etc. in multiple parts.

As used herein, the term "correspond" encompasses a range of relative relationships between two or more elements. Correspond may refer to equality (e.g., match). Correspond may refer to partial-equality (e.g., partial match, fuzzy match, soundex). Correspond may refer to a value which falls within a range of values.

As used herein "receive" or "receiving" may include specific algorithms for obtaining information. For example, receiving may include transmitting a request message for the information. The request message may be transmitted via a network as described above. The request message may be transmitted according to one or more well-defined, machine readable standards which are known in the art. The request message may be stateful in which case the requesting device and the device to which the request was transmitted maintain a state between requests. The request message may be a stateless request in which case the state information for the request is contained within the messages exchanged between the requesting device and the device serving the request.

One example of such state information includes a unique token that can be generated by either the requesting or serving device and included in messages exchanged. For example, the response message may include the state information to indicate what request message caused the serving device to transmit the response message.

As used herein "generate" or "generating" may include specific algorithms for creating information based on or using other input information. Generating may include retrieving the input information such as from memory or as provided input parameters to the hardware performing the generating. Once obtained, the generating may include combining the input information. The combination may be performed through specific circuitry configured to provide an output indicating the result of the generating. The combination may be dynamically performed such as through dynamic selection of execution paths based on, for example, the input information, device operational characteristics (e.g., hardware resources available, power level, power source, memory levels, network connectivity, bandwidth, and the like). Generating may also include storing the generated information in a memory location. The memory location may be identified as part of the request message that initiates the generating. In some embodiments, the generating may return location information identifying where the generated information can be accessed. The location information may include a memory location, network locate, file system location, or the like.

As used herein a "user interface" (also referred to as an interactive user interface, a graphical user interface or a UI) may refer to a network based interface including data fields and/or other controls for receiving input signals or providing electronic information and/or for providing information to the user in response to any received input signals. A UI may be implemented in whole or in part using technologies such as hyper-text mark-up language (HTML), FLASH™, JAVA™, .NET™, web services, and rich site summary (RSS). In some embodiments, a UI may be included in a stand-alone client (for example, thick client, fat client) configured to communicate (e.g., send or receive data) in accordance with one or more of the aspects described.

While the above detailed description has shown, described, and pointed out novel features as applied to various embodiments, it can be understood that various omissions, substitutions, and changes in the form and details of the devices or algorithms illustrated can be made without departing from the spirit of the disclosure. As can be recognized, certain embodiments described herein can be embodied within a form that does not provide all of the features and benefits set forth herein, as some features can be used or practiced separately from others. The scope of certain embodiments disclosed herein is indicated by the appended claims rather than by the foregoing description. All changes which come within the meaning and range of equivalency of the claims are to be embraced within their scope.

What is claimed is:

1. A system for implementation of a reinforcement machine learning environment, the system comprising:
   a plurality of computing devices corresponding to a simulation environment for a set of simulated, hosted customer networks, wherein individual simulated, hosted customer networks include a convolutional neural network agent process for generating and transmitting training data, wherein the training data is embodied as state information of the hosted customer network, action information of the hosted customer network, reward information of the hosted customer network, and observation information of the simulated, hosted customer network; and a non-transitory computer readable medium storing instructions that, when executed by the at least a processing device, cause the system to perform operations including:

receive a request from a customer computing device to provide a trained machine learning model that is trained in accordance with a reinforcement learning model on training data generated from an identified simulated, hosted customer network;

responsive to the request from the customer computing device, selecting a first simulated, hosted customer network from a set of simulated, hosted customer networks using the received request as selection criteria;

responsive to the received request, obtain the training data from a convolutional neural network agent associated with the first simulated, hosted customer network;

process the training data in accordance with the reinforcement learning model to form the trained machine learning model; and provide, to the customer computing device, access to the trained machine learning model in response to the request.

2. The system of claim 1, wherein the convolutional neural network agent on the hosted customer network is configured to:

cause one or more actions to be implemented in the simulated, hosted customer network via an interface;

collect the observation information and state information responsive to the one or more actions implemented in the simulated, hosted customer network; and form the training data in view of the one or more action and collected observation information and state information.

3. The system of claim 1, wherein the system performs further operations including obtain a specification of at least one parameter from the reinforcement learning model.

4. The system of claim 1, wherein the reinforcement learning model corresponds to at least one of a Markov decision process or a partially observable Markov decision processes.

5. The system of claim 1, wherein the simulation environment is operable to receive at least one configuration attributes for the simulated, hosted customer network.

6. The system of claim 1, wherein the reinforcement learning-based machine learning cluster is further configured to automatically select a first simulated, hosted customer network from a set of simulated, hosted customer networks using the received request as selection criteria.

7. A computer-implemented method to manage machine learning models based on independently hosted customer networks, the method comprising:

receiving a request to provide a trained machine learning model that is trained in accordance with a reinforcement learning model on training data generated from an identified simulated, hosted customer network that simulates an independently hosted customer network;

in response to the received request, selecting a first simulated, hosted customer network from a set of simulated, hosted customer networks using the received request as selection criteria;

subsequent to the received request, obtaining training data via an interface from one or more agents associated with the simulated, hosted customer network, wherein the training data is embodied as state information of the independently hosted customer network, action information of the independently hosted customer network, reward information of the simulated, hosted customer network, and observation information of the simulated, hosted customer network;

processing the training data in accordance with a reinforcement learning model to form the trained machine learning model; and providing the trained machine learning model in response to the request.

8. The computer-implemented method of claim 7, wherein the training data is generated by the one or more agents associated with the simulated, hosted customer network.

9. The computer-implemented method of claim 7, wherein the one or more agents collect the observation information and state information responsive to one or more actions implemented in the simulated, hosted customer network.

10. The computer-implemented method of claim 9, wherein the one or more agents utilize an interface to generate the one or more actions in the simulated, hosted customer network.

11. The computer-implemented method of claim 7 further comprising receiving at least one specification of a parameter for the reinforcement learning model.

12. The computer-implemented method of claim 7, wherein the simulated, hosted customer network corresponds to a third-party provider of training data.

13. The computer-implemented method of claim 7 further comprising selecting one or more attributes of the reinforcement learning model based on receipt of the training data.

14. The computer-implemented method of claim 7, wherein the one or more agents include a convolutional neural network.

15. A computer-implemented method to manage machine learning models based on simulated, hosted customer networks, the computer-implemented method comprising:

receiving a request to provide a trained machine learning model that is trained in accordance with a reinforcement learning model on training data from one or more identified simulated, hosted customer networks;

in response to the received request, selecting a first simulated, hosted customer network from a set of simulated, hosted customer networks using the received request as selection criteria;

responsive to the request, causing a simulation of one or more independently hosted customer networks;

obtaining training data via an interface from one or more agents associated with individual simulated, hosted customer networks, wherein the training data is embodied as information for implementation of a reinforcement learning machine learning algorithm;

processing the training data in accordance with a reinforcement learning model to form the trained machine learning model without access to the one or more hosted customer networks; and providing the trained machine learning model in response to the request.

16. The computer-implemented method of claim 15, wherein the training data includes state information of the one or more independently hosted customer networks, action information of the one or more independently hosted customer networks, reward information of individual simulated hosted customer networks, and observation information of individual simulated hosted customer networks.

17. The computer-implemented method of claim 16, wherein the training data is generated by the one or more agents associated with the individual simulated, hosted customer networks.

18. The computer-implemented method of claim 16, wherein the one or more independently hosted customer networks corresponds to an independent source of training data.

19. The computer-implemented method of claim 16, wherein the one or more agents include a convolutional neural network.

20. The computer-implemented method of claim 16, wherein selecting a first simulated, hosted customer network from a set of simulated, hosted customer networks using the received request as selection criteria includes automatically selecting a first simulated, hosted customer network from a set of simulated, hosted customer networks using the received request as selection criteria.

\* \* \* \* \*